United States Patent
Minnis et al.

(10) Patent No.: US 7,092,461 B1
(45) Date of Patent: Aug. 15, 2006

(54) POLYPHASE RECEIVERS

(75) Inventors: Brian J. Minnis, Crawley (GB); Paul A. Moore, Seaford (GB)

(73) Assignee: Koninikljke Philips Electronics N.V., Eindhoven (NL)

( * ) Notice: Subject to any disclaimer, the term of this patent is extended or adjusted under 35 U.S.C. 154(b) by 717 days.

(21) Appl. No.: 09/710,830

(22) Filed: Nov. 13, 2000

(30) Foreign Application Priority Data

Nov. 19, 1999 (GB) ................... 9927289.0

(51) Int. Cl.
*H03D 3/22* (2006.01)
*H04L 27/22* (2006.01)

(52) U.S. Cl. ............ 375/329; 375/308; 375/279; 375/280; 375/331; 348/534; 455/210; 455/308

(58) Field of Classification Search ........ 375/222, 375/261, 340, 330, 332, 215, 316, 210, 259, 375/279, 329, 308, 130, 322, 280, 350, 240.25, 375/331; 455/266, 200, 109, 324, 302, 200.1, 455/234.1, 308, 210; 370/210, 395.53; 330/301; 329/337; 348/727, 534
See application file for complete search history.

(56) References Cited

U.S. PATENT DOCUMENTS

| | | | |
|---|---|---|---|
| 4,821,120 A * | 4/1989 | Tomlinson ............ 348/727 |
| 5,375,255 A | 12/1994 | Baier et al. ............ 455/72 |
| 5,404,589 A * | 4/1995 | Bijker et al. .......... 455/266 |
| 5,703,910 A * | 12/1997 | Durvaux et al. ........ 375/322 |
| 5,715,529 A * | 2/1998 | Kianush et al. ........ 455/266 |
| 6,078,799 A * | 6/2000 | McDowell et al. ...... 455/302 |
| 6,081,697 A * | 6/2000 | Haartsen ............... 455/109 |
| 6,215,354 B1 * | 4/2001 | Kolanek et al. .......... 330/2 |
| 6,278,870 B1 * | 8/2001 | Davie et al. ........... 455/302 |
| 6,577,855 B1 * | 6/2003 | Moore et al. ........... 455/324 |
| 6,922,555 B1 * | 7/2005 | Mohindra .............. 455/314 |

* cited by examiner

Primary Examiner—Kevin Burd
Assistant Examiner—Ted M. Wang

(57) ABSTRACT

A polyphase receiver comprises an RF front end (10 to 28) for receiving a wanted data signal modulated on a carrier signal and for producing quadrature related low IF signals, an image rejection filter formed by a polyphase filter (30) for filtering the quadrature related low IF signals, soft limiting means (36,38) for compressing the dynamic range of the filtered quadrature related IF signals and a signal demodulator (41) for recovering the data signal. The soft limiting means (36,38) has a characteristic which is substantially linear at signal levels 10 dB below a predetermined minimum wanted signal level, moves into compression for higher signal levels and hard limits at substantially 10 dB above the desired receiver sensitivity which avoids degrading the sensitivity of the receiver.

9 Claims, 4 Drawing Sheets

Figure 1:
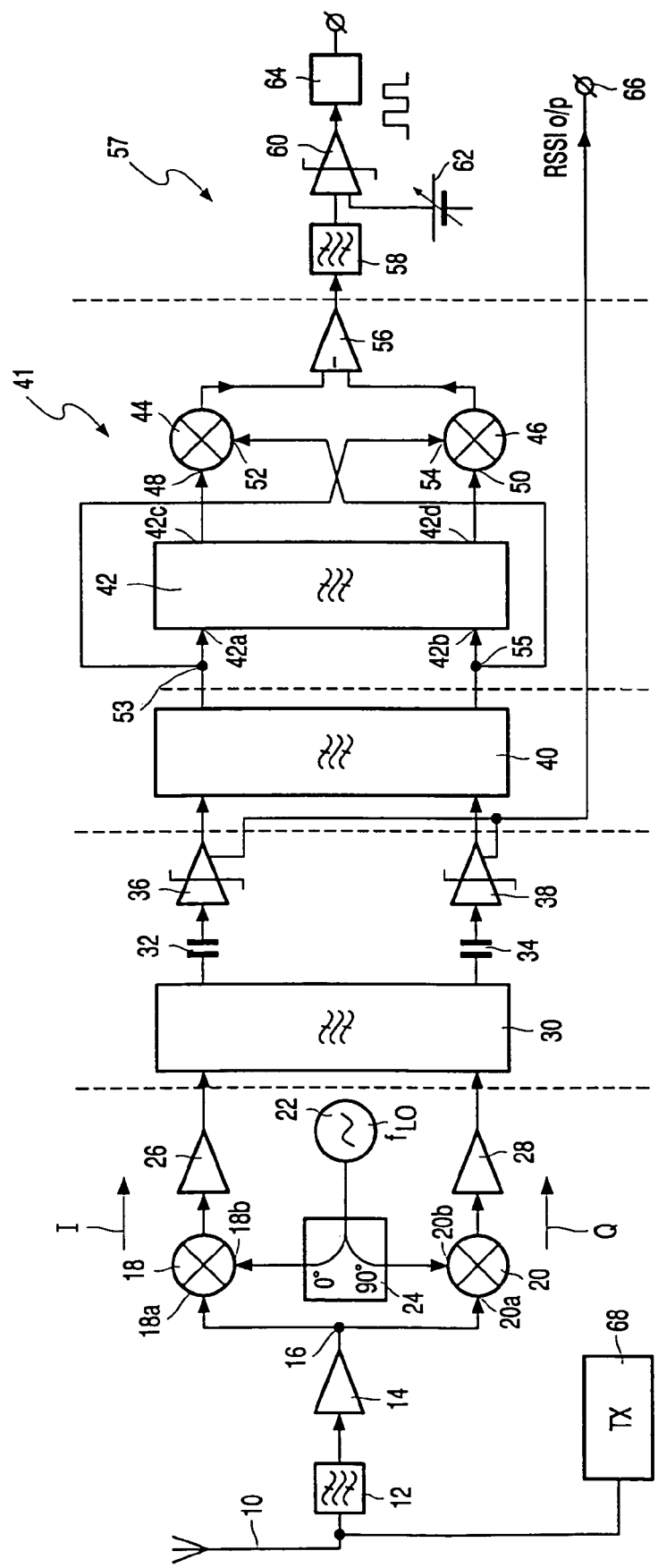

Output vectors showing phase errors near a zero-crossing in I:

I&Q output components:

POLYPHASE RECEIVERS

The present invention relates to a polyphase receiver and to a transceiver comprising a polyphase receiver as its receiving section. The present invention has particular, but not exclusive, application to integratable receivers/transceivers for use in portable telecommunications devices such as cellular and cordless telephones.

For convenience of reference in the present specification and claims, the word "receiver" is to be understood to include the receiving section of a transceiver.

Conventional radio receivers almost invariably use a superheterodyne architecture. In this architecture, the wanted signal, having previously been modulated onto a radio frequency (RF) carrier at the transmitter, is mixed with a local oscillator (LO) signal and thereby translated to a fixed intermediate frequency (IF) where unwanted interfering signals are removed by the use of highly selective filters.

Limiters have found widespread use in superheterodyne receivers designed to receive frequency modulated (FM) transmissions. They alleviate the need for automatic gain control (AGC) and enhance the receiver's immunity to amplitude modulated (AM) interference. Typically they operate at a point in the receiver where the IF is very high compared to the baseband modulation.

In the interests of making integrated receivers a zero-IF architecture has been the most successful so far but is not without problems in respect of recovering modulated signals containing wanted information at or near the carrier frequency and which are translated to DC and low frequencies.

"Polyphase" or low IF receiver architectures are becoming more widespread for receivers used in digital communication systems. These systems use an IF of the order of half the bit rate such that during a bit period there is only a single zero crossing in the quadrature related I and Q IF signals. The use of hard limiters in these circumstances has been found to impair severely the sensitivity of the receiver. Noise from the receiver front end will cause errors in the timing of the zero crossings and with a hard limiter, these timing errors translate into large phase errors, which in turn translate into bit errors.

An object of the present invention is to avoid large zero crossing timing errors in polyphase receivers.

According to the present invention there is provided a polyphase receiver in which quadrature related low IF signals are soft limited prior to being demodulated.

The present also provides a polyphase receiver comprising means for receiving a wanted data signal modulated on a carrier signal and for producing quadrature related low IF signals, soft limiting means for compressing the dynamic range of the quadrature related low IF signals and signal demodulation means for recovering the data signal.

The present invention further provides a polyphase receiver comprising means for receiving a wanted data signal modulated on a carrier signal and for producing quadrature related low IF signals, image rejection filtering means for filtering the quadrature related low IF signals, soft limiting means for compressing the dynamic range of the filtered quadrature related IF signals and signal demodulation means for recovering the data signal. The image rejection filtering means may comprise polyphase filtering means.

Compared to using hard limiters, the soft limiting means has the benefit that any noise in the I and Q components of the quadrature related low IF signals does not generate such large phase errors/bit errors. As a consequence a low IF receiver incorporating soft limiters achieves a similar sensitivity as that of a superheterodyne receiver and has the additional benefit that much of the receiver can be integrated.

In an embodiment of the present invention the soft limiting means has a characteristic which is linear for signal levels which are of the same order as that of the front end noise, is several dB into compression for signals at a specified sensitivity level of the receiver and applies hard limiting when the input signal signal is 10 dB above the receiver sensitivity.

Figure 2A:
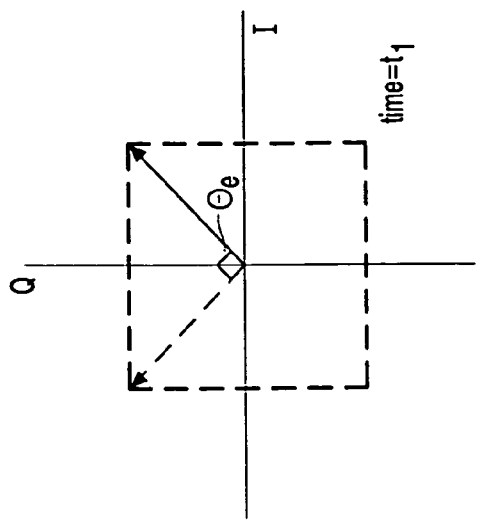
Figure 3A:
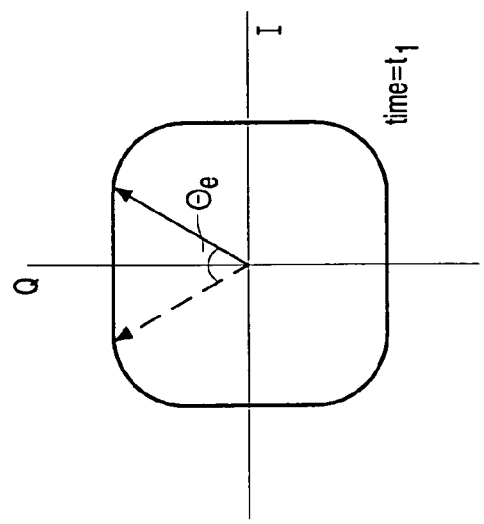
Figure 4A:
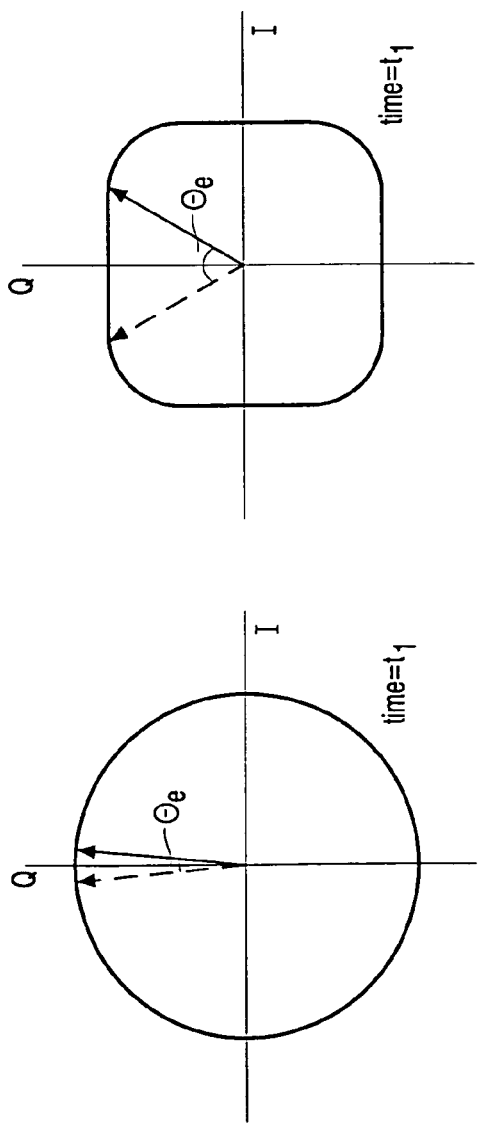
Figure 2B:
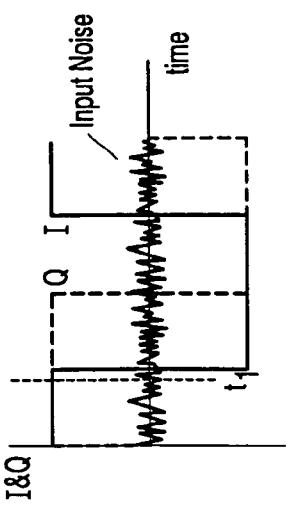
Figure 3B:
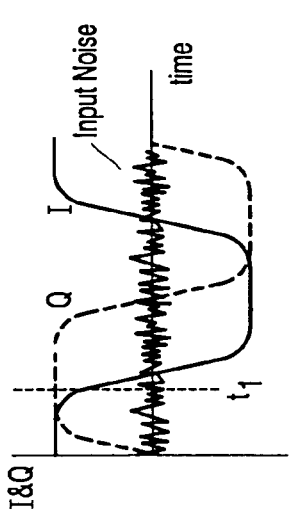
Figure 4B:
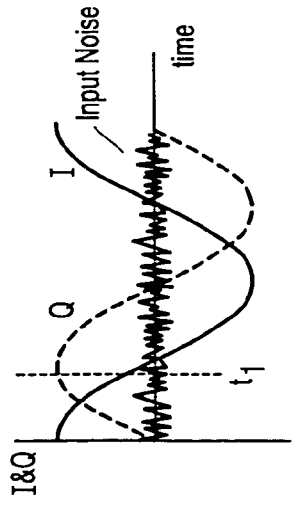
Figure 5:
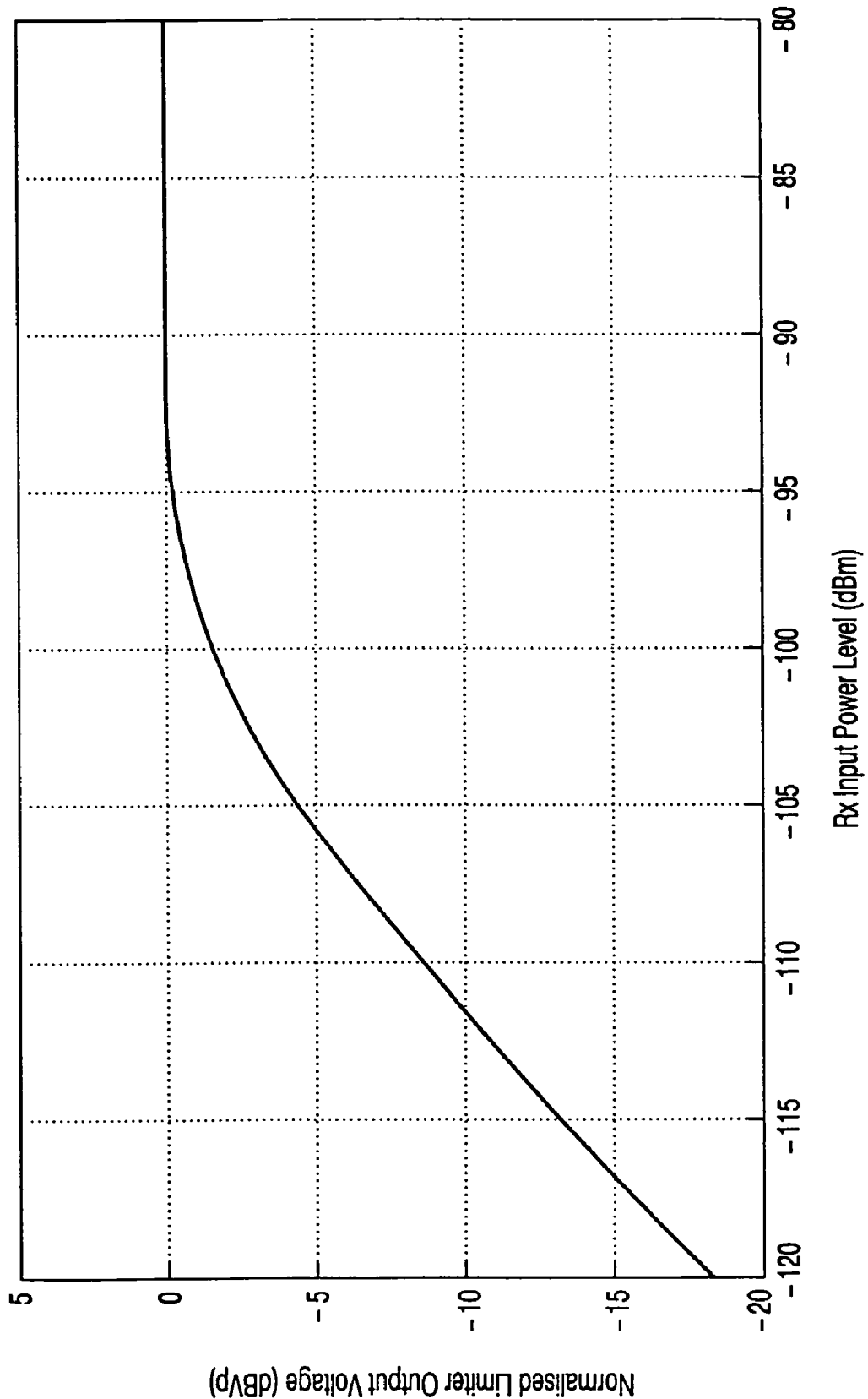
Figure 6:
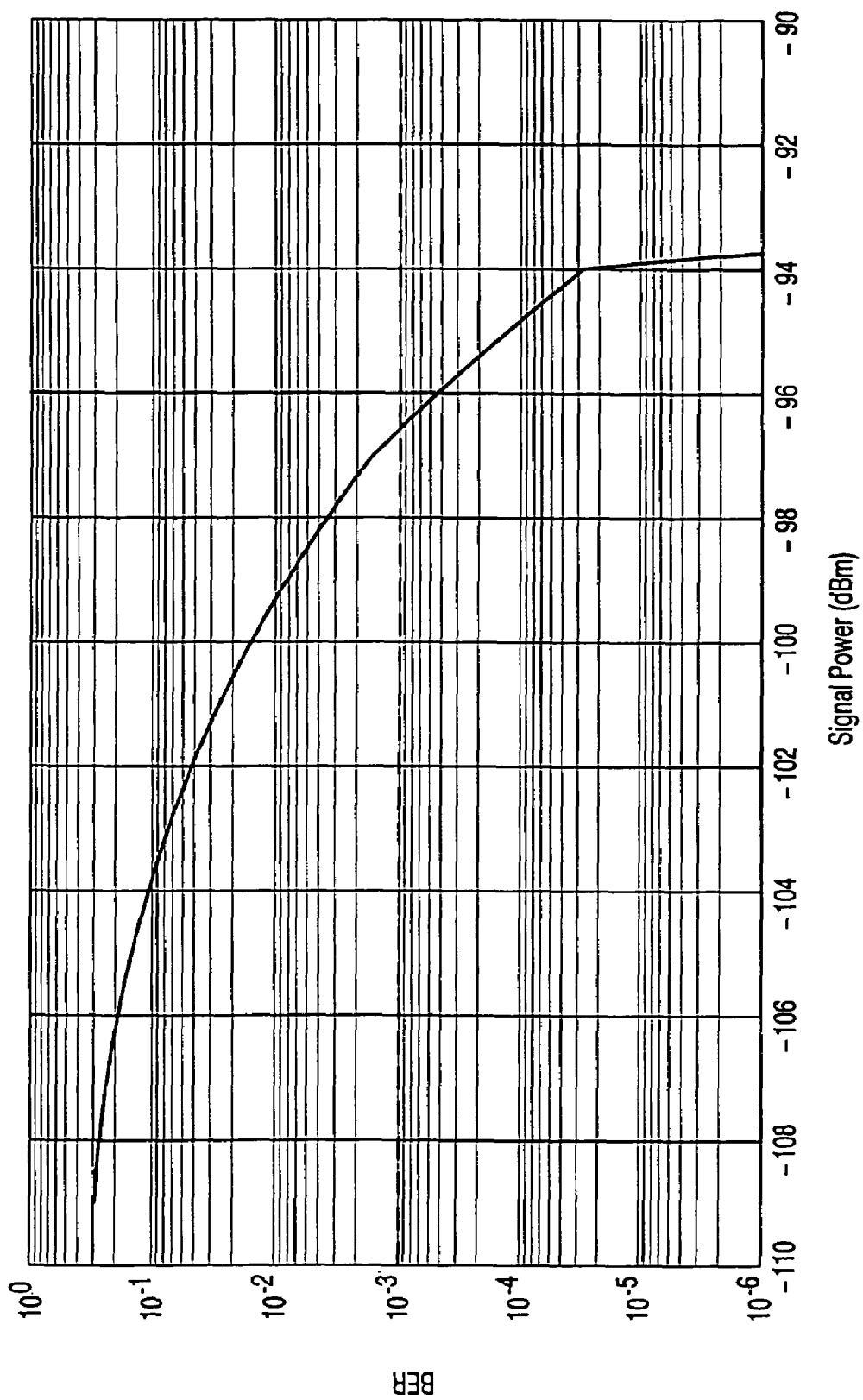

The present invention will now be described, by way of example, with reference to the accompanying drawings, wherein;

FIG. 1 is a block schematic diagram of an embodiment of a polyphase receiver,

FIGS. 2A and 2B respectively show output vectors for the case where phase errors are near a zero-crossing in the I component and the I and Q components when no limiting is applied, FIGS. 3A and 3B respectively show output vectors for the case where phase errors are near a zero-crossing in the I component and the I and Q components when soft limiting is applied, FIGS. 4A and 4B respectively show output vectors for the case where phase errors are near a zero-crossing in the I component and the I and Q components when hard limiting is applied, FIG. 5 illustrates a soft limiter compression characteristic, and FIG. 6 shows a Bit Error Rate (BER) simulation of a DECT receiver with soft limiters.

In the drawings the same reference numerals have been used to indicate similar features.

The polyphase receiver shown in FIG. 1 comprises an antenna 10 which is coupled via a band defining bandpass filter 12 to a low noise RF amplifier 14. An output of the amplifier 14 is coupled to a signal splitter 16 from which signals are applied to signal inputs 18a, 20a of quadrature related mixers 18, 20. A local oscillator 22 implemented as a frequency synthesiser has an output frequency $f_{LO}$ which is applied to a phase shifter 24 providing an 0° phase signal to a local oscillator input 18b of the mixer 18 and a 90° phase shifted signal to a local oscillator input 20b of the mixer 20. The local oscillator frequency $f_{LO}$ is chosen to provide a low IF signal having a frequency of the order half the bit rate. The quadrature related low IF I and Q signals are amplified in respective IF amplifiers 26, 28 and their outputs are applied to an image rejection filter formed by a polyphase IF filter 30. DC break capacitors 32, 34 are shown connected to the respective outputs of the polyphase IF filter but in reality this is diagrammatic because DC breaks are distributed throughout the signal paths of the IF signals. Soft limiting amplifiers 36, 38 are coupled to the I and Q signal paths from the polyphase IF filter 30.

The soft limited output signals from the soft limiting IF amplifiers 36, 38 are applied to a polyphase harmonic filter 40 which eliminates the harmonics of the wanted signal generated in the soft limiting amplifiers 36, 38. As these harmonics are displaced asymmetrically about zero frequency, it is preferred to use a polyphase filter.

A polyphase frequency discriminator 41 is coupled to the outputs of the harmonic filter 40 in order to demodulate the IF signals. The discriminator 41 comprises a bandpass filter 42 having I and Q inputs 42a, 42b coupled to respective outputs of the harmonic filter 40. Respective outputs 42c, 42d of the filter 42 are coupled to first inputs 48, 50 of multipliers 44, 46.

Second inputs 52, 54 of the multipliers are cross coupled to junctions 55, 53, respectively, on the signal paths to the inputs 42a, 42b of the filter 42. A subtracting stage 56 has inputs coupled to outputs of the multipliers 44, 46, respectively, and an output coupled to a baseband filtering and bit slicer stage 57. The stage 57 comprises a data filter 58 which removes high-frequency noise produced by the discriminator 41 as part of its intrinsic behaviour. The data filter 58 is a low pass filter whose cut-off frequency is in the region of half the bit rate to allow the passage of the highest fundamental frequency expected to be present in the data stream comprising an alternating sequence of logical 1 and logical 0. The data filter 58 is coupled to one input of a bit slicer circuit 60 which has another input for a threshold voltage supplied by a source 62. The bit slicer circuit 60 supplies data bits to a decoder 64.

Optionally an RSSI output 66 can be derived from the soft limiting amplifiers 36, 38.

For convenience of description the operation of the receiver shown in FIG. 1 will be described with respect to the DECT (Digitally Enhanced Cordless Telecommunications) Standard.

In operation the RF signals received at the antenna 10 are applied to the band defining filter 12 after which they are amplified in the low noise amplifier 14. The local oscillator frequency $f_{LO}$ is set at the lower edge of the wanted channel. Hence a wanted channel of width 1728 kHz becomes translated down to a low IF of 864 kHz. Simultaneously, all of the other potentially active channels in the DECT band are mixed down to frequencies on either side of the wanted channel. Conventional, real filtering could be used to reject most of these interfering signals but the adjacent channel positioned on the lower side of the wanted signal requires special treatment. As the adjacent channel is centred on an IF of −864 kHz, it is located precisely at the same frequency as the image of the wanted channel. In order to discriminate between these two signals the polyphase filter 30 is used to process the I and Q signals from the mixers 18,20 as a complex pair. The use of the polyphase filter 30 enables the desired rejection to be applied to the adjacent channel. The amplifiers 26, 28 are provided to enable the I and Q signals to be in the appropriate dynamic range for entry into the polyphase filter. Sufficient gain must be applied to ensure that the noise generated by the polyphase filter 30 is insignificant when referred back to the front end of the receiver.

The distributed DC breaks represented by the capacitors 32, 34 introduce a notch in the spectrum of the IF signal at DC which is wide enough to give the receiver adequate recovery time but not too wide to cause distortion of the modulation. In the case of DECT it has been found that 50 kHz is an optimum cut-off frequency.

The soft limiting amplifiers 36, 38 compress the dynamic ranges of the I and Q signals obtained from the polyphase IF filter 30 in preparation for subsequent demodulation. In the case of a DECT receiver the amplifiers 36, 38 have a compression characteristic of the form shown in FIG. 5. This characteristic is substantially linear at signal levels 10 dB below the minimum wanted signal level, in the same vicinity of the front-end noise at −107.6 dBm the characteristic progressively moves into compression as the signal level increases and at the sensitivity level of −96 dBm, the voltage swing of the limiters will have reached 95% of full scale. Hard limiting only occurs when the signal level is roughly 10 dB above the required receiver sensitivity. Consequently the limiting amplifiers 36, 38 no longer degrade the sensitivity of the receiver.

The non-linearities in the limiting amplifiers 36, 38 generate harmonics of the wanted signal which may be removed by filtering. As these harmonics are displaced symmetrically about zero frequency, then if it is decided to remove them by filtering it is desirable to continue with the complex signal processing and to use a polyphase device as the harmonic filter 40

The polyphase discriminator 41 comprises a polyphase filter 42 which is centred on the IF of 864 kHz.

The signal bandwidth of the demodulated signal is filtered in the filter 58 to remove any high frequency noise produced by the discriminator 41. As mentioned above, the cut-off frequency of the filter 58 is set in the region of the highest fundamental frequency expected to be present in the data stream which in this example is 576 kHz.

If the receiver shown in FIG. 1 comprises the receiving section of a transceiver, a transmitter section 68 is also provided and is connected to the antenna 10. Wherever possible the transmitter section makes use of components, such as the local oscillator 22, provided in the receiving section.

Referring to FIGS. 2A, 2B, FIGS. 3A, 3B and FIGS. 4A, 4B which illustrate respectively a) the receiver using no limiter at all (FIGS. 2A, 2B), b) the receiver using a soft limiter (FIGS. 3A, 3B), and c) the receiver using a hard limiter (FIGS. 4A, 4B).

In the case where no limiter is used, FIGS. 2A, 2B, and the signal is merely amplified in a linear amplifier, noise at the input approximately 10 dB below the wanted signal will cause occasional timing errors in the zero crossings of the I or Q component. In the case of the I component as shown in FIG. 2A, an early zero crossing at a time $t_1$ will result in a relatively small phase error, $\theta_e$, in the complex signal vector. A small error like this would be unlikely to cause a bit error after demodulation since this would require a phase error of something approaching 90°. In the case of the soft limiter, FIGS. 3A, 3B, the same noise at the input could also cause an erroneous zero crossing at time $t_1$, but owing to the increased gain, the corresponding phase error $\theta_e$ is now increased as shown in FIG. 3A. Exactly how large the error becomes depends on the dynamic characteristic of the limiter. In practice the aim is to keep the increase small enough to ensure that a bit error is still unlikely for the given level of input signal. In the case of the hard limiter, FIGS. 4A, 4B, the gain in the vicinity of a zero crossing is now extremely large. The input noise will generate full-scale transitions in the polarity of the I and Q signal components and therefore if the transitions take place at the wrong instant in time, the phase errors $\theta_e$ produced will be a full 90°. In a low-IF receiver where the IF is approximately half the symbol rate (1152 kHz for DECT), there is only 1 zero crossing in each of the I and Q signal components per symbol which means the 90° phase error would be very likely to generate a bit error. This situation does not improve until the signal level rises to a point where the input noise becomes insignificant. Hence the hard limiter degrades the receiver sensitivity.

FIG. 6 illustrates a BER simulation of a DECT receiver with soft limiting amplifiers having the compression characteristics shown in FIG. 5, the BER falls substantially at −92 dBm and achieves the required sensitivity figure $10^{-3}$, indicated by the horizontal broken line, at an input power of −96.6 dBm, the target input power being −96.0 dBm as indicated by the vertical emboldened line. Allowing for antenna losses of 3 dB the receiver has a sensitivity which passes the DECT specification by the substantial margin of 10 dB.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of polyphase receivers and component parts therefor and which may be used instead of or in addition to features already described herein.

The invention claimed is:

1. A polyphase receiver in which quadrature related low IF signals are soft limited prior to being demodulated, said receiver comprising, coupled to inputs of polyphase filtering means and prior to demodulation, soft limiting amplifying means for adjusting the dynamic range of the quadrature related low IF signals for entry into the polyphase filtering means, wherein the soft limiting means have a characteristic which is substantially linear at signal levels 10 dB below a predetermined minimum wanted signal level, moves into compression for higher signal levels and hard limits at substantially 10 dB above a desired receiver sensitivity.

2. An integrated receiver comprising those parts of the polyphase receiver as claimed in claim 1 which are integratable.

3. An integrated transceiver comprising a polyphase receiver as claimed in claim 1 and a transmitter.

4. The polyphase receiver of claim 1, wherein said amplifying means comprises separate, respective amplification means for said inputs.

5. A polyphase receiver comprising:
   means for receiving a wanted data signal modulated on a carrier signal and for producing quadrature related low IF signals,
   soft limiting means for compressing the dynamic range of the quadrature related low IF signals prior to being demodulated; and
   signal demodulation means for recovering the wanted data signal, wherein soft limiting amplifying means are coupled to inputs of a polyphase filtering means prior to demodulation for adjusting the dynamic range of the quadrature related low IF signals for entry into the polyphase filtering means, wherein the soft limiting means have a characteristic which is substantially linear at signal levels 10 dB below a predetermined minimum wanted signal level, moves into compression for higher signal levels and hard limits at substantially 10 dB above a desired receiver sensitivity.

6. The polyphase receiver of claim 5, wherein said receiver further including signal demodulation means for recovering the wanted data signal.

7. A polyphase receiver as claimed in claim 5, characterized in that the signal demodulation means comprises a polyphase discriminator and a data filter.

8. The polyphase receiver of claim 5, wherein said amplifying means comprises separate, respective amplification means for said inputs.

9. A polyphase receiver comprising:
   means for receiving a wanted data signal modulated on a carrier signal and for producing quadrature related low IF signals,
   soft limiting means for compressing the dynamic range of the quadrature related low IF signals, wherein the soft limiting means have a characteristic which is substantially linear at signal levels 10 dB below a predetermined minimum wanted signal level, moves into compression for higher signal levels and hard limits at substantially 10 dB above a desired receiver sensitivity; and
   signal demodulation means for recovering the wanted data signal, characterised by polyphase filtering means coupled between outputs of the soft limiting means and inputs of the signal demodulation means.

* * * * *